United States Patent [19]
Orlicki et al.

[11] Patent Number: 5,818,499
[45] Date of Patent: Oct. 6, 1998

[54] RECORDING HEAD WITH INTEGRALLY MOUNTED IMPEDANCE ELEMENTS

[75] Inventors: David Mark Orlicki, Rochester; Karen Lynn Herczeg, Webster, both of N.Y.

[73] Assignee: Eastman Kodak Company, Rochester, N.Y.

[21] Appl. No.: 672,605

[22] Filed: Jun. 28, 1996

[51] Int. Cl.$^6$ ............................................. G08G 15/00
[52] U.S. Cl. ............................................. 347/237; 347/238
[58] Field of Search ............................................. 347/130, 132, 347/232, 237, 238

[56] References Cited

U.S. PATENT DOCUMENTS 4,653,895  3/1987  Deguchi et al. .......................... 347/238
5,400,063  3/1995  Kappel ........................................ 347/58

FOREIGN PATENT DOCUMENTS 0 645 924 A1  3/1995  European Pat. Off. .

*Primary Examiner*—Peter S. Wong
*Assistant Examiner*—Y. J. Han
*Attorney, Agent, or Firm*—Norman Rushefsky

[57] ABSTRACT

A printhead includes a plurality of recording elements such as LEDs each having a light output characteristic related to a driving parameter such as current. A plurality of driver circuits establishes the driving parameter for driving the recording elements. The driver circuits are mounted on a circuit board. A flex circuit having a conductive pattern electrically connects the driver circuits to the recording elements. The driver circuits include resistors for use in regulating the driving parameter. In lieu of mounting the resistors on the circuit board, the resistors are instead advantageously mounted on the flex circuit for controlling current to the respective recording elements. This allows the resistors and recording elements to be replaced without the need to also replace or modify the circuit board in the event that more efficient recording elements are to be used.

10 Claims, 7 Drawing Sheets

RECORDING HEAD WITH INTEGRALLY MOUNTED IMPEDANCE ELEMENTS

BACKGROUND OF THE INVENTION

1. Field of the Invention

The present invention relates in general to the field of electronic printing.

2. Brief Description of the Prior Art

In published European Application 0 645 924 A1, there is disclosed a printer that includes a sparse array LED printhead or recording head comprising an integrated array of light-emitting diodes (LEDs) supported within a rotating drum that is focused with a single optical system onto a photographic medium fixed to a concentrically mounted cylindrical shoe. The LEDs are modulated so as to raster scan image information onto the photosensitive medium as the drum rotates and is axially translated through the shoe. Data is transmitted via a rotary transformer channel from the stationary to the rotating frame of reference at a rate dictated by the measured rotational rate of the print drum. As may be seen in FIG. 1, the LEDs are arranged in a 3×4 rectangular pattern or array 34.

A given physical pixel element on the medium is exposed by each of the twelve LED elements which are driven with currents corresponding to the red, green and blue (RGB) subpixel components of the data corresponding to that location. In particular, the pixel at location R(x,y), G(x,y), B(x,y) is first exposed with pixel data R(x,y) through LED R1. After n pixel intervals of fast scan direction translation, R(x,y) is again used to drive R2 and so on. After N lines of page direction translation, LED G1 is aligned with the physical location and is driven with the G (x,y) data. After n pixel intervals G(x,y) is exposed through LED G2 and so on. The process is again repeated for B(x,y) data with LEDs B1 through B4 after N more lines of page scan translation.

As may be seen in FIG. 2, data for determining enablements of the LEDs is generated by a suitable electronic data source which may be a color electronic document scanner, computer and electronic data reader (noted generally as data source 10). The data is subject to color image processing by a processor 12 and then subject to distribution by a data distribution device 14, an example of which is described in commonly assigned U.S. application Ser. No. 08/123,833, the contents of which are incorporated herein by reference. The device 14 outputs the data to a series of taps 16 associated with the array. Control of the printer is provided by a logic and control unit 16 (LCU) that is suitably programmed and uses one or more microcomputers to provide the functions described herein in accordance with well known operation of such printers. A programmable power supply 18 is provided and controlled by the LCU to output the various control voltages, two of which $V_{REF}$ and +V will be described in greater detail below. The multibit grey level digital data defining each subpixel is converted to LED drive currents by an array of digital to analog converters (DACs) of bit width or depth M, wherein M can be say 12.

The configuration of a typical prior art DAC and current driver section is shown in FIG. 3. As may be seen in FIG. 4, the current driver circuit 25 includes the DAC circuitry which are located on a printed circuit board 20 attached to the printer rotor and connected through a flex circuit to the LED array 34. Three LEDs are shown as representative of the twelve typically used in the array 34. LEDs may be installed or replaced en masse as part of the entire flex assembly. The current through an LED 39 is determined by the bias value +V and the output of the DAC which is input to one input of the comparator 26. Comparator 26 supplies a voltage potential at its output to the base of a transistor 27. A current sense resister $R_s$ is connected between ground and the output of the transistor. The potential at the front end of the resistor is fed back to the comparator 26 to control output of the current driver 25.

The selection of the DAC reference voltage $V_{ref}$ which sets the maximum DAC output voltage, and the current sense resistor $R_s$ depends on the value of the bias voltage of each LED, +V, and the maximum LED current required. The value of $R_s$ is typically invariant over a set of LEDs of a given color, but varies from color to color ($R_{SR}$, $R_{SG}$, $R_{SB}$) depending on the radiance of the LEDs and the sensitivity of the recording medium.

It is desirable to maximize $V_{ref}$ in order to maximize the magnitude of the least significant bit (LSB) output voltage relative to the noise floor of the electronics. It is further desirable to minimize the bit width M of the DAC in order to minimize component cost and serializer channel bandwidth. Minimum M is constrained by the requirement of the overall photographic system, including the response of the recording medium to faithfully reproduce a specified minimum image density step.

The relationship between DAC resolution and image density for a particular medium exposure characteristic is depicted in FIG. 5A. Exposure E is directly proportional to LED current and the efficiency of the LEDs in converting current to light. Printer performance specifications dictate a maximum output density $D_{max}$, and a maximum density step size, which is specified small enough so as to render the appearance of uniformly smooth density transitions in the output image. These specifications translate through the density versus exposure characteristic of the recording medium to corresponding values of $E_{max}$ and $\Delta E_{min}$; i.e., the maximum required exposure (current) and the minimum required exposure step size. DAC resolution is then bounded by equation (1).

$$M \geq \log 2(E_{max}/\Delta E_{min})$$

It is typical in high quality digital printers to require over 200 uniformly spaced density steps and a $D_{max}$ of over 2.0. The nonlinear density versus exposure characteristic of the recording media typically dictates M≧12 bits. $V_{ref}$ and $R_s$ are chosen such that $I_{diode}$ at the maximum code value, and for a specified exposure time provides exposure $E_{max}$. Note that exposure for any particular color is the sum of exposures from all contributing LEDs of that color.

Consider the impact on DAC performance of increases in LED radiant efficiency as shown in FIG. 5. The original density versus exposure curve is repeated along with two and four times faster versions resulting from two and four times more efficient LEDs, respectively. For fixed values of $E_{max}$ and M, the system is not capable of resolving the required minimum density step size. That is, the exposure step driven by a single LSB code value change drives a density change greater than the minimum specified magnitude.

The straightforward means to achieve the desired minimum step size with higher radiance LEDs is to simply increase M. There are, however, several drawbacks to this approach. Hardware cost increases nearly exponentially and serial transmission bandwidth increases linearly with bit depth. In addition, increasing M reduces the LSB voltage relative to the noise floor of the printer and may actually degrade perceived image quality.

Another means for restoring dynamic range when installing higher radiance LEDs is to simultaneously increase the value of $R_s$ used in the current source. This typically might be accomplished either by packaging the sense resistors in pluggable modules or by selecting from a set of permanently installed resistors by means of user settable switches. Both schemes suffer the drawbacks of decreased reliability due to the potential of operator error in reconfiguring the current sources and the requirement that the operator change both the LED flex assembly to replace the LEDs and a separate module/switch on the rotor electronics printed circuit board.

SUMMARY OF THE INVENTION

It is an object of the invention to provide for a printhead structure that allows matching of the sense resistors with the efficiencies of the LEDs in a more efficient manner. This eliminates opportunity for errors and provides a reduction in numbers of different parts for a manufacturer or a service organization to stock.

These and other objects and advantages of the invention are realized by a printhead comprising a recording element having an output characteristic related to a driving parameter; a driver circuit for establishing the driving parameter for driving the recording element; a flex circuit having a conductive pattern for electrically connecting the driver circuit to the recording element; driving parameter regulating means mounted on the flex circuit for cooperating with the driver circuit to establish the driving parameter for driving the recording element.

In accordance with another aspect of the invention, there is provided an assembly part for use in a printhead, the assembly part comprising a plurality of recording elements; a flex circuit having a conductive pattern for electrically connecting driver circuits to the recording elements; and resistors on the flex circuit for controlling current to the respective recording elements.

DESCRIPTION OF THE PREFERRED EMBODIMENTS OF THE INVENTION

The present invention will be described with respect to one typical printer system; however, it will be appreciated that the invention is also applicable and finds utility in other printing systems.

Figure 1:
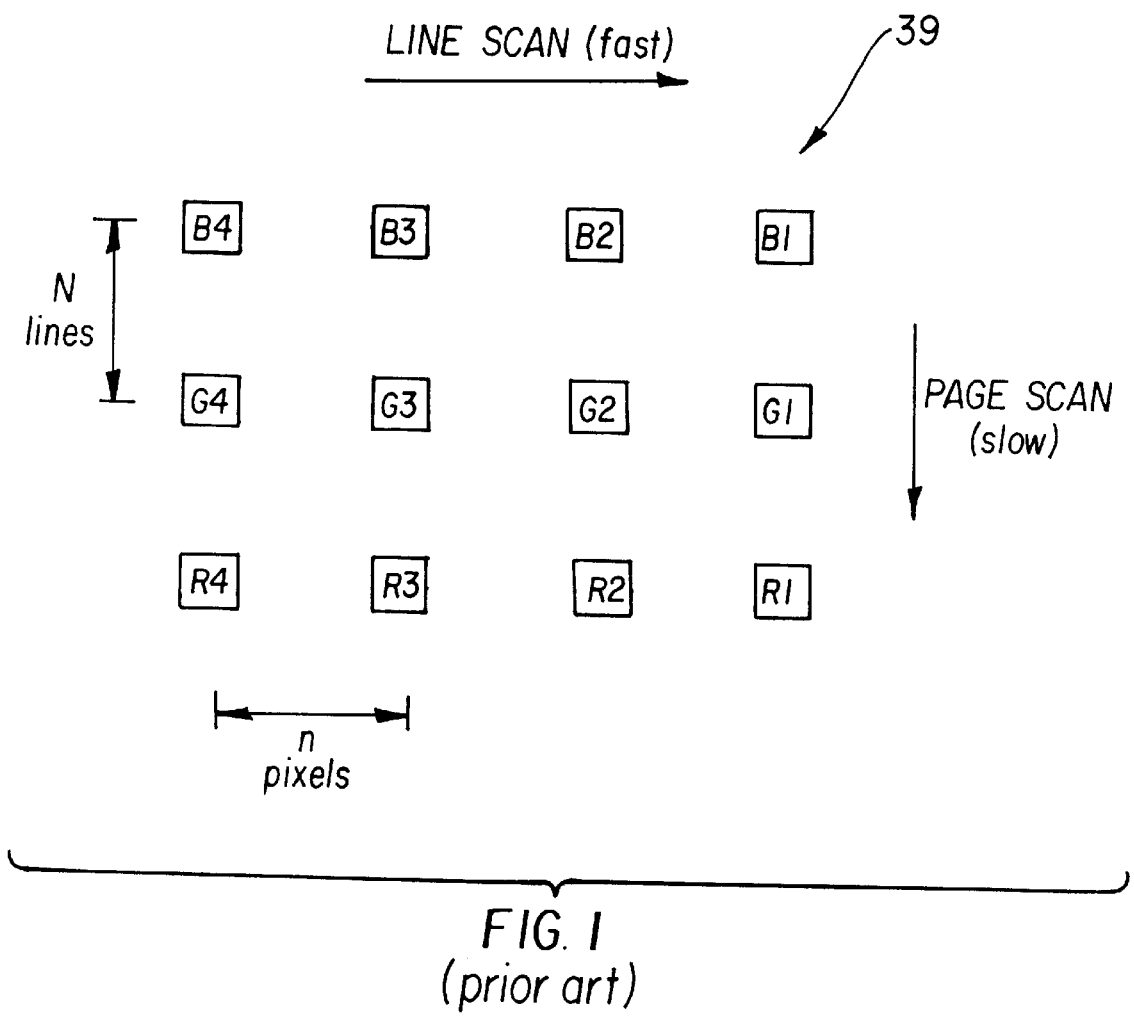
FIG. 1 is a schematic illustrating a rectangular arrangement of LEDs in a sparse array printhead in accordance with the prior art.
Figure 2:
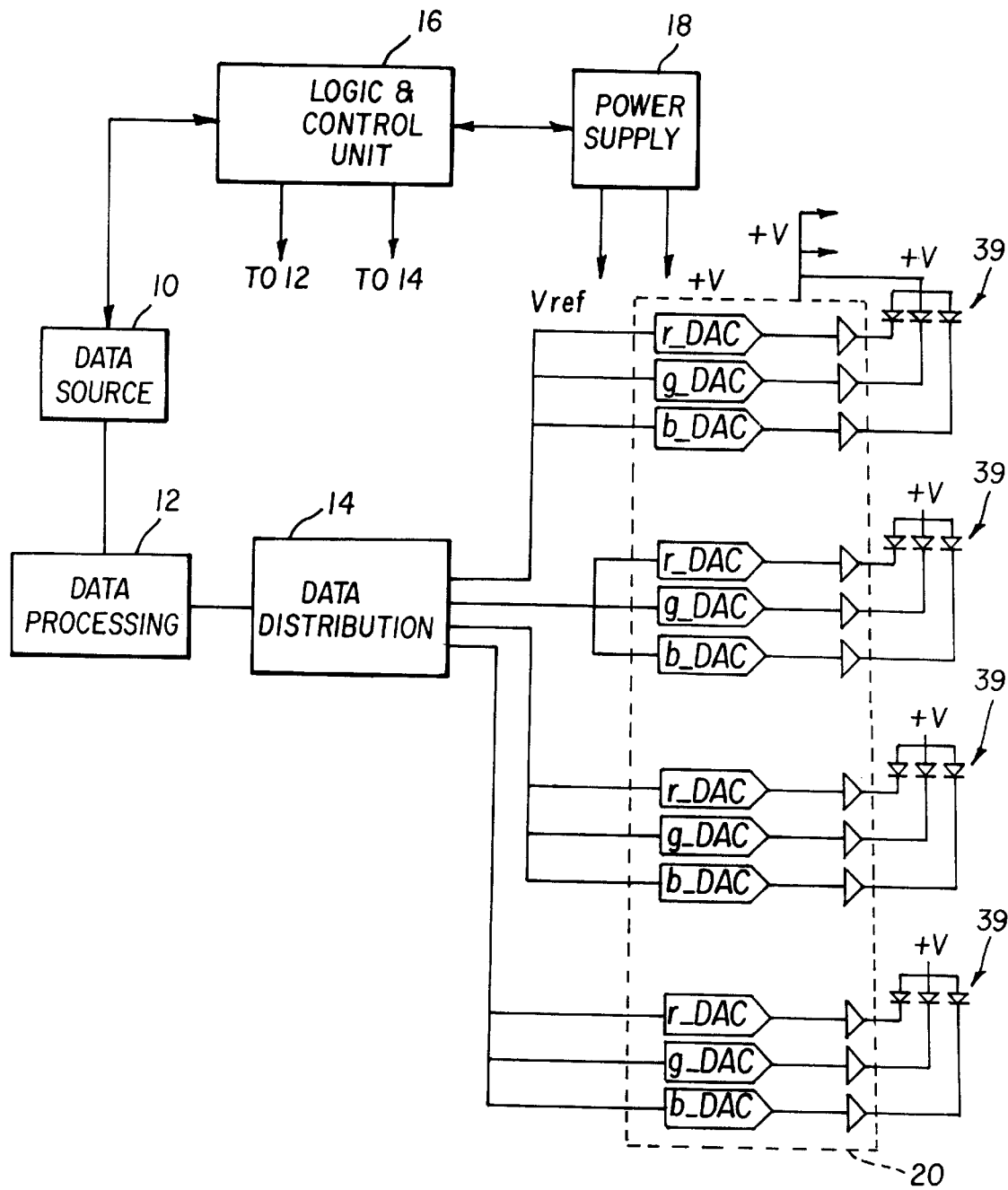
FIG. 2 is a block diagram schematic illustrating an arrangement of various components of a sparse array LED printhead in accordance with the prior art.

With reference to EP 0 645 924 A1, there is known a rotary printer apparatus 10 employing a multi-beam color exposure assembly of type illustrated in FIGS. 1 and 2. This exposure assembly includes a rotor 11 coupled to a drive motor 12 via a drive shaft 14. The drive shaft 14 is supported by a support pedestal structure 16 which hangs from a translator base 18 which is supported for movement along a pair of guide rails 20. The rotor is arranged to spin and move axially within a stationary cylindrical print shoe 22 which is provided with a sheet of a photographic recording medium 24 on the inner surface thereof. The rotor 11 is attached to a linear translation assembly comprising the pedestal structure 16 and the translator base 18, and a lead screw mechanism 26 driven by a stepper motor 28, with the lead screw being connected to the translator base 18 by a coupling 30. The rotor is simultaneously rotated by drive motor 12 in a fast scan direction and is translated past the stationary print shoe in the slow scan direction (axially) by the stepper motor 12, lead screw 26 and coupling 30, thereby achieving a raster scan pattern on the photographic recording medium held within the print shoe.

Figure 3:
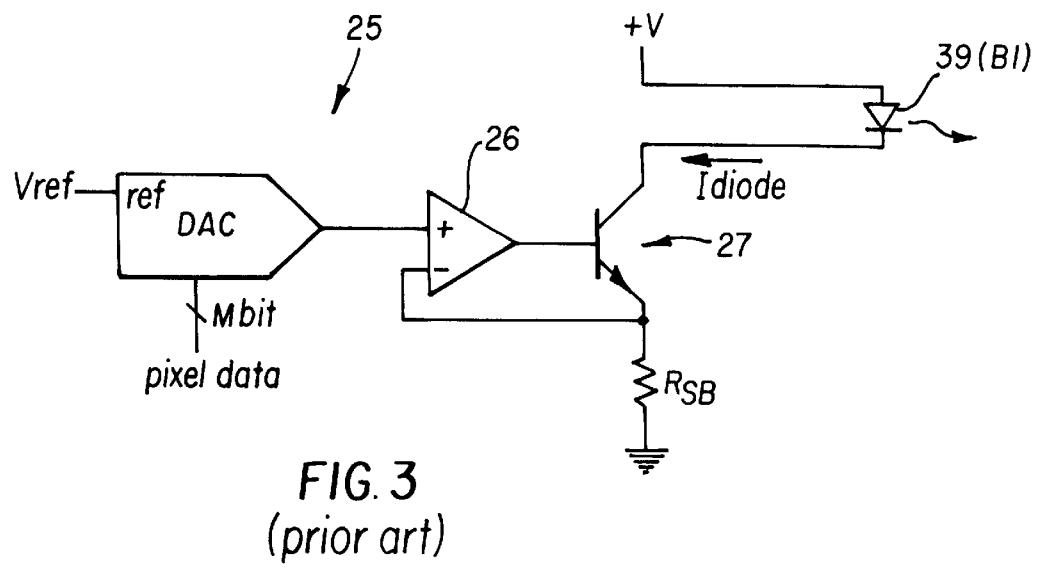
FIG. 3 is a block diagram schematic of a typical driver circuitry for driving the LEDs of FIG. 1 in accordance with the prior art.
Figure 4:
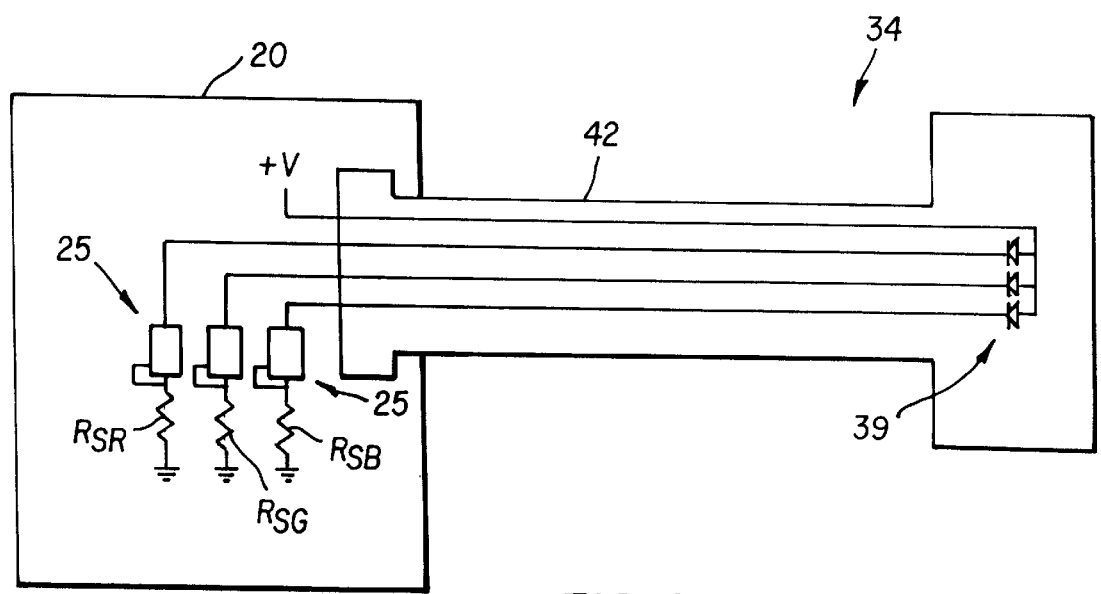
FIG. 4 is a schematic illustrating a flex circuit connection of the driver circuitries on a circuit board with the LEDs of FIG. 1 in accordance with the prior art.
Figure 5A:
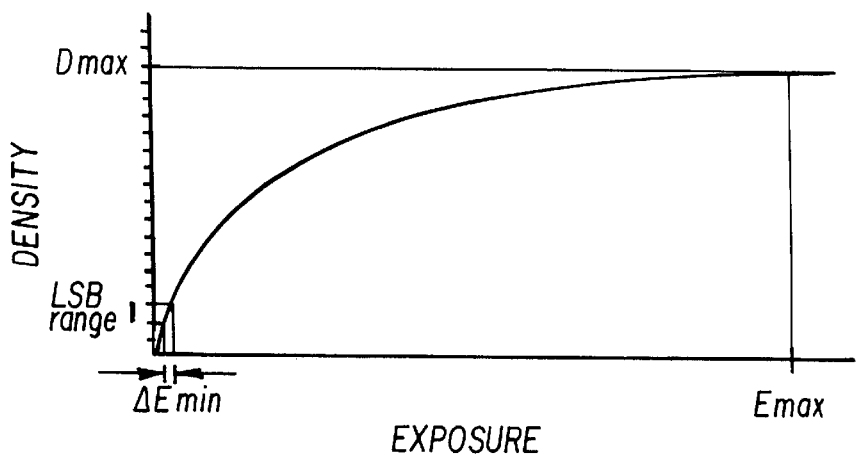
FIGS. 5A–C are a series of graphs each illustrating minimum density step size versus medium exposure speed of a light-sensitive recording medium.
Figure 5B:
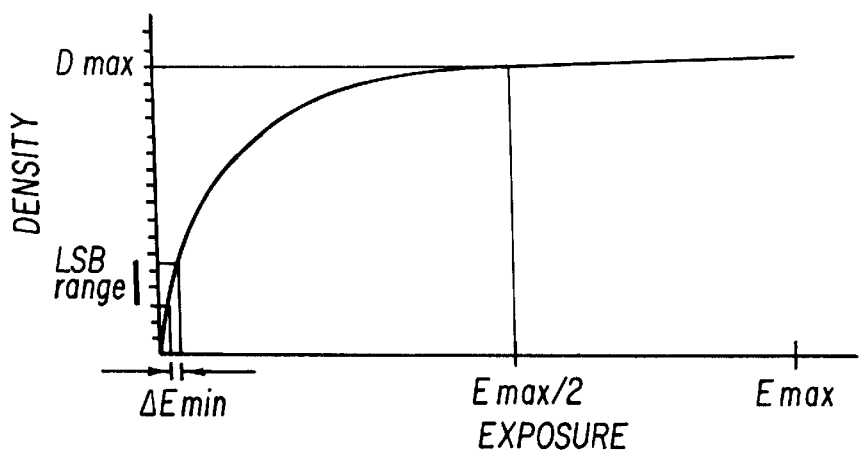
Figure 5C:
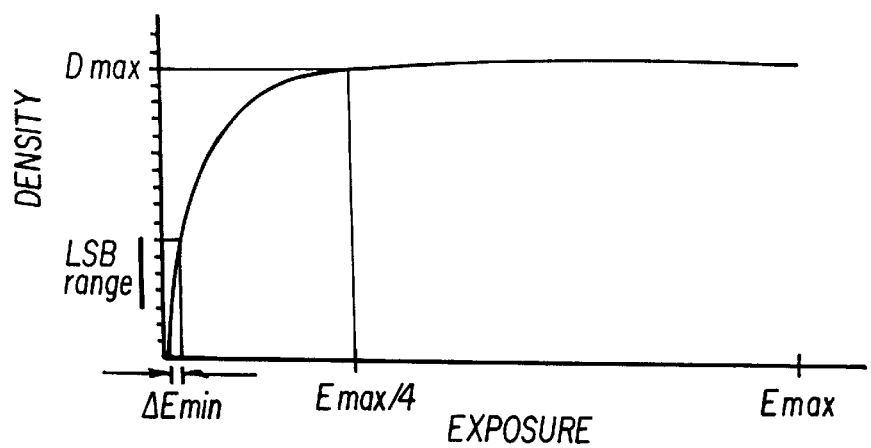
Figure 6:
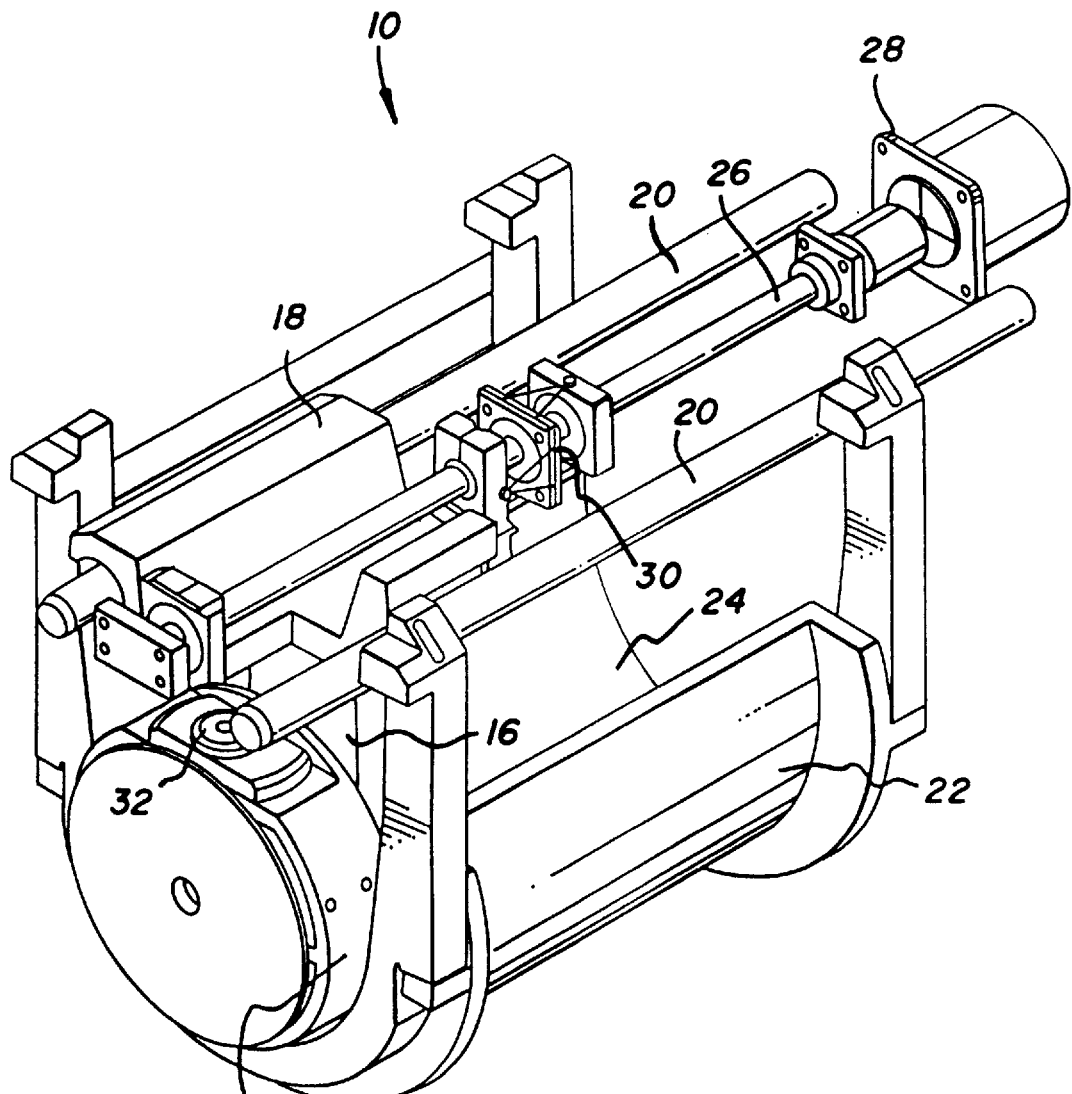
FIG. 6 is a perspective view of a rotary printing system of the prior art and in which the invention is useful.
Figure 7:
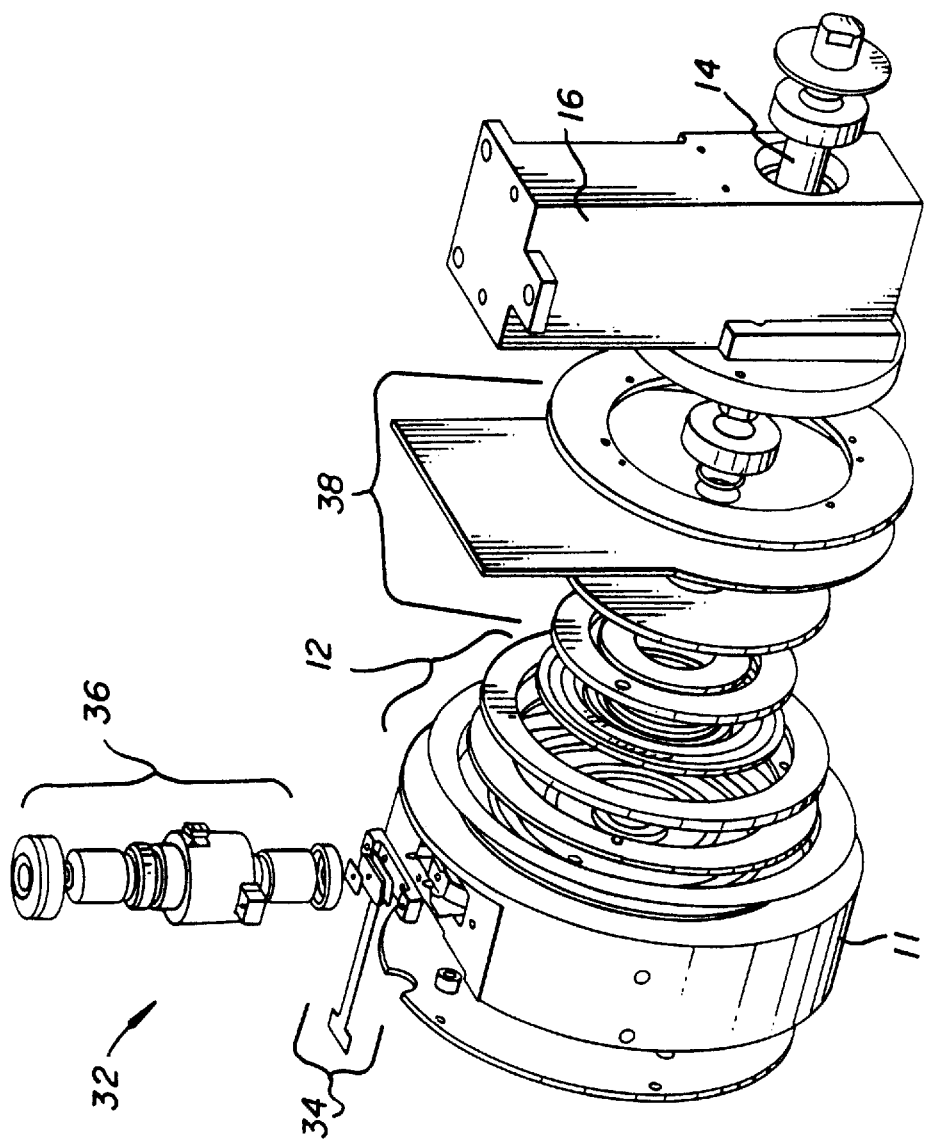
FIG. 7 is an exploded perspective view of the rotor of the system shown in FIG. 6.

An LED printhead assembly 32 is mounted in the rotor 11 and comprises a plurality of mono-color light sources such as an array of LEDs 34 (see FIGS. 3 and 4), and a projection lens assembly 36. The printhead assembly is located within the body of the rotor, as shown in FIG. 2, with the LED array package positioned so that the LED aperture output surface is located in a plane which is perpendicular to the optical axis of the projection lens assembly. The projection lens is arranged to simultaneously image or focus all of the LEDs in the array onto a surface located in close proximity above the outer surface of the rotor, and more particularly, onto the surface of the photosensitive material held by the print shoe 22. A single lens thereby images or focuses the plurality of LEDs onto the photosensitive material as a plurality of individual images which constitute the writing beams that expose the image pixels.

Image and clock data, and power to drive the LED array, are transmitted to the rotor via a rotary transformer 38, the primary winding of which is mounted to the pedestal structure 16 and the secondary winding of which is mounted to the rotor 11 in accordance with the teachings of the above-identified copending application in the names of Orlicki et al. An encoder mechanism (not shown) is also provided to synchronize the activation of the LED array with the rotation of the rotor and the transfer of the digital image data and power to the LED array as the rotor rotates.

The LED array 34 described herein is arranged to generate a continuous-tone, full-color image from a digital input signal. The LED array is shown in greater detail in FIGS. 1 and 8 and comprises twelve individual LEDs 39, arranged in three columns of four LED's each, configured such that the columns are arranged substantially parallel to the fast scan direction of movement of the rotor, i.e. the rotation of the rotor. The three columns each correspond to red, green and blue LEDs, respectively; thus, the first column contains four red LEDs, $R_1$–$R_4$, the second column contains four green LEDs, $G_1$–$G_4$, and the third row contains four blue LEDs, $B_1$–$B_4$, with the columns of light sources, and the lines of images produced thereby, being substantially parallel and spaced in he slow scan 35 direction of movement of the rotor.

Figure 8:
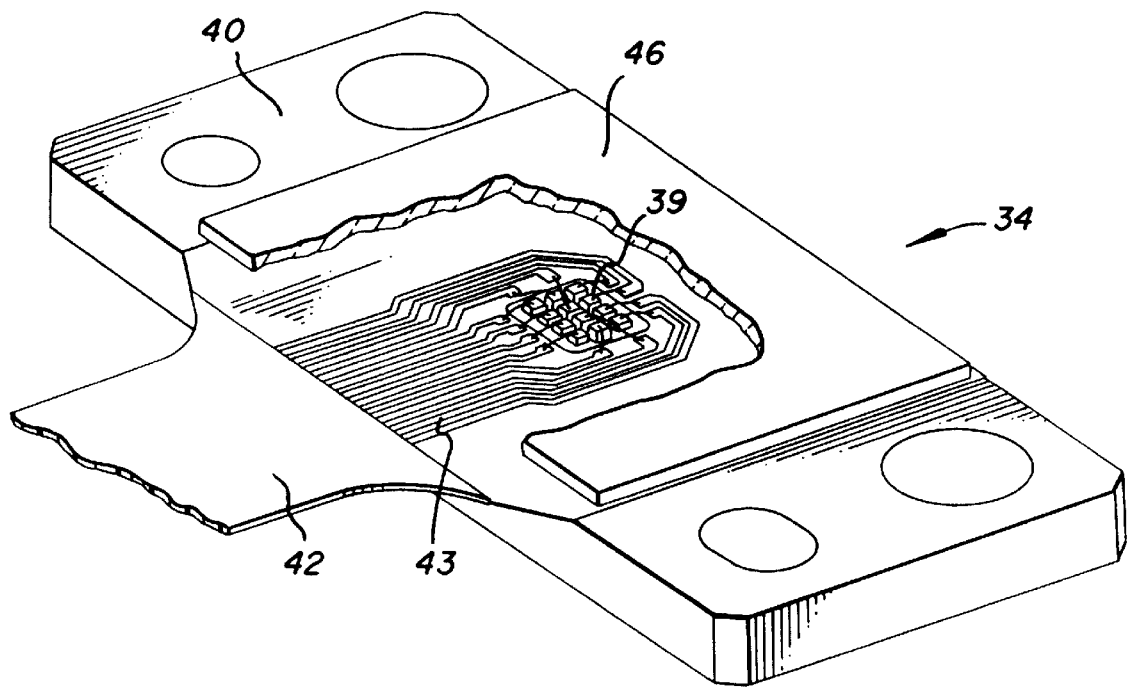
FIG. 8 is a greatly enlarged view of a flex circuit and LEDs supported on a heatsink from a part of the rotor on the prior art print system of FIG. 7.

Referring to FIG. 8, the LED array 34 is fabricated on a relatively thick block 40 of copper which acts as an efficient heat sink structure as well as a common anode electrode for all of the individual LEDs 39. Each individual LED 39 is formed with an aperture cathode electrode allowing a direct optical view of the light-emitting portion of the diode. The aperture cathode on each LED allows a direct view of the LED junction, thereby allowing a large fraction of the emitted optical radiation to be collected and conveyed by the projection lens assembly to form a writing beam or spot on the photographic recording medium. The LEDs are mounted on the heat sink 40 so that the aperture cathodes 41 lie in a common plane. Each LED in the printhead is individually modulated with image data by applying appropriate levels of drive current to achieve any of a multiplicity of exposure levels, in the preferred embodiment 4096 different levels are available, not all of which need be used for generation of a continuous tone image. A polyimide flex circuit 42 (see FIG. 8) is provided with a rectangular aperture to provide clearance for the LED array, and with an appropriate number of gold-flashed copper signal traces 43 and bond pads, is soldered or adhesively bonded to the copper heat sink. The back surface of the flex circuit is a solid copper ground plane which functions as the electrically common anode connector. An individual electrical connection is made to each LED by a wire bond from the LED cathode surface to the bond pads on the flex circuit 30. The opposite end of the flex circuit is connected to the LED drive electronics in the rotor 11.

A precision aperture array mask is fabricated using a 0.010" thick glass substrate 46 coated on both surfaces with a broadband anti-reflection coating (e.g., $MgF_2$) and subsequently coated (on one surface only) with an electrically nonconductive black opaque coating 48 such as Si or black polyimide. The array pattern of three columns of four square apertures each is etched in the opaque coating on precise centers using precision photo-lithographic methods. The array aperture mask is then aligned to the LED array 39 and is mounted to the top of the polyimide flex circuit structure 30 with a perimeter epoxy bond, thereby sealing the array to form a flex circuit and LED array assembly. The size and shape of the aperture will determine the size and shape of the writing spot on the recording medium.

The LED array is positioned within the body of the rotor such that optical radiation from each individual LED is collected and 11 conveyed to form a separate and distinct writing spot on the stationary photosensitive recording medium 24 located in close proximity to the circumferential surface of the rotor. In the preferred embodiment, this is accomplished by a known reflective optical system 36, but may also be accomplished with a refractive optical system.

As disclosed above, the LED array comprises three columns of four LEDs each; with each column comprised of a single color, and with at least one of the rows having a different color than the other rows and, preferably, with one row each having one of red, green and blue color light output. In the preferred embodiment the individual LEDs in each of the columns are spaced such that the writing spots are spaced an integral number of pixel distances apart when imaged onto the photographic recording medium, and is thus referred to as a sparse array. This facilitates simplicity in image data clock-out. In a like manner, each of the columns is located an integral number of line distances apart when imaged onto the photosensitive material. In the preferred embodiment, the writing spots produced by the four LEDs in each column are spaced a distance of four pixels apart when imaged on the photosensitive material, and the columns are spaced a distance of four lines apart.

In recording on the photosensitive material, three columns of four pixels each on the photosensitive material will receive simultaneous exposures. When the photosensitive material or recording medium is conventional photographic paper, one column of pixels will be exposed by the red LEDs, one column will be exposed by the green LEDs and one column will be exposed by the blue LEDs (assuming that all colors of an individual pixel are to be exposed). As the rotor 11 and thus the printhead assembly 32 move along a helical path, comprising both rotational and translational components, a first column of red pixels will be exposed on the photographic recording medium by the column of four red LEDs, with each pixel being exposed to an exposure from each red LED of approximately one-quarter of the total red exposure called for by the image-bearing information signal. Four scan lines later, the first column of pixels will be exposed to the column of green LEDs and four scan lines later, to the column of blue LEDs. Thus, the LED array is configured such that in the final print image, each pixel can receive 12 successive exposures, if the information signal calls for such an exposure. As noted above, the array is mounted such that four LEDs of the same color are aligned in the direction of the fast scan (achieved by rotation of the rotor) and deliver four successive exposures of the same color in rapid succession to the same image pixel 'X'. In the preferred embodiment, the time between exposures is an integral number of pixel times for simplification of image data clock-out, and is minimized to reduce unwanted latent image decay (intermittency effect) which would be manifested as reduced exposure efficiency.

As noted in the above discussion of the prior art, a problem with the above system is that in manufacturing of such printer systems over the course of time, improvements in exposure efficiency are made in both LEDs and/or the exposure medium. That is newer LEDs may provide greater light output for the same current generated by the drivers through the LEDs. Alternatively and/or additionally, improvements in formulation of an exposure medium provide for a more light sensitive recording medium. In manufacture of printing systems, it is more efficient from a manufacturing point of view to provide for production of a part having identical components. The inventors have realized that a problem exists in limiting production of driver circuit boards because such circuit boards may become obsolete through changes in LED efficiency requiring boards with different sensor resistors. The inventors have realized that since the LEDs and their supporting structure are mounted to the flex circuit as an assembly part it would be more efficient to not change the parts composition of the driver circuitry but instead to have the sensor resistors be mounted on the flex circuit and in this way a part is realized (flex circuit and LED array assembly) that cannot be mistakenly substituted; i.e., the appropriate sensor resistor is always associated with the appropriate LEDs. Thus, after manufacture, this flex circuit and LED assembly 34 constitute a part for inventory.

Figure 9:
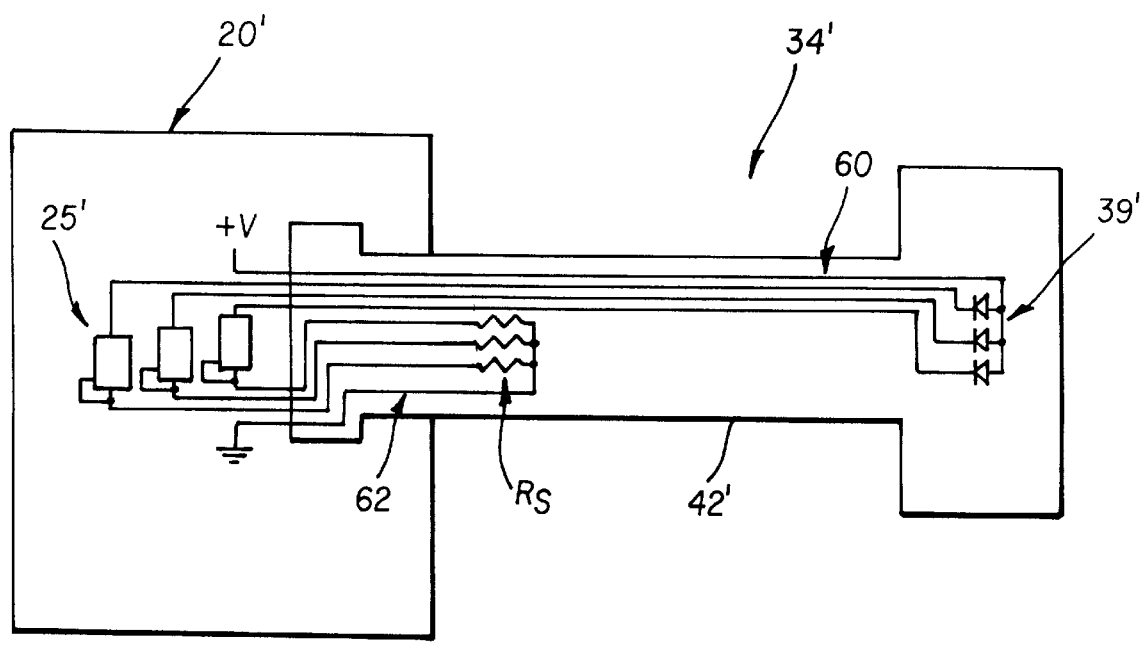
FIG. 9 is a schematic illustrating the improved driver circuitry of the invention.

In light of the above and with reference to FIG. 9, there is shown a schematic of a driver circuitry board 20' and LED array flex circuit assembly 34' with only structure for 3 LEDs shown; however, it will be understood that more or fewer can be provided in accordance with the teaching herein. For use with the apparatus described above, there will be 12 LEDs and 12 sensor resistors. As may be seen in FIG. 9, the sensor resistors $R_s$ are shown mounted now on the flex circuit 42' rather than on the driver circuitry board 20'. The improved flex circuit 42' includes a first set of conductors 60 connecting the driver circuits 25' on the circuit board 20' to the LEDs 39' including one or more conductors for providing power to the LEDs. The flex circuit 42' additionally includes a second set of conductors 62 connecting both terminals of each sensor resistor $R_s$ to the circuit board 20'. This provides the advantage noted above allowing substitution of the LED array flex circuit part 34' without needed changes to other parts. Although, with improved light output by the LEDs, there may be a need for adjustment of data there is eliminated the need to introduce switches or other changes in hardware except for the new LED array and flex circuit assembly part.

The invention thus provides improved means for manufacturing LED arrays with integral sense resistors which enable the use of a fixed set of driver electronics to provide optimal LED current drive for uniform color balance and dynamic range independent of LED radiant efficiency. The need for such an innovation arises from the desirability to incorporate higher efficiency LEDs in printheads as they become available without requiring field changes to drive electronics or compromise of the dynamic range of the printer's density versus exposure performance. The primary advantages of higher efficiency LEDs are increased printing speed and reduced thermal stress in the printhead.

While the invention is described with reference to LEDs, it will be appreciated that the invention finds applicability to other types of recording elements such as laser, thermal recording elements, electrographic recorders, etc. In addition, the invention may be broadly usable with other impedance means or current regulating devices such as a transistor(s), etc. Broadly, these are referred to as a driving parameter regulating means.

The invention has been described in detail with particular reference to preferred embodiments thereof and illustrative examples, but it will be understood that variations and modifications can be effected within the spirit and scope of the invention.

What is claimed:

1. A printhead comprising:

a recording element having an output characteristic related to a driving parameter;

a driver circuit for establishing the driving parameter for driving the recording element;

a flex circuit having a first conductive pattern for electrically connecting the driver circuit to the recording element;

driving parameter regulating means mounted on the flex circuit for cooperating with the driver circuit to establish the driving parameter for driving the recording element; and the flex circuit including a second conductive pattern connecting the driver circuit to the driving parameter regulating means and a third conductive pattern connecting the driving parameter regulating means to ground.

2. The printhead of claim 1 and wherein the driver circuit includes a digital to analog converter.

3. A printhead comprising:

a plurality of recording elements, each having an output characteristic related to a driving parameter;

a plurality of driver circuits for establishing the driving parameter for driving the recording elements;

a flex circuit having a first conductive pattern electrically connecting the driver circuits to the recording elements;

driving parameter regulating means mounted on the flex circuit for controlling current to the respective recording elements; and the flex circuit including a second conductive pattern connecting the driver circuits to the driver parameter regulating means and a third conductive pattern connecting the driving parameter regulating means to ground.

4. The printhead of claim 3 and wherein the driver circuits each include a digital to analog converter.

5. The printhead of claim 3 and wherein some of said recording elements emit light in a different color from others of said recording elements.

6. The printhead of claim 5 and wherein said driving parameter regulating means are associated with respective recording elements and have different driving parameter regulating values.

7. The printhead of claim 6 and wherein the driving parameter regulating means are resistors.

8. An assembly part for use in a printhead, the assembly part comprising:

a plurality of recording elements;

a flex circuit having a first conductive pattern for electrically connecting driver circuits to the recording elements; and resistors on the flex circuit for controlling current to the respective recording elements; and the flex circuit including a second conductive pattern for connecting the driver circuits to the resistors and a third conductive pattern for connecting the resistors to ground.

9. The assembly part of claim 8 and wherein some of said recording elements emit light in a different color from others of said recording elements.

10. The assembly part of claim 9 and wherein said resistors are associated with respective recording elements and have different resistance values.

* * * * *